(12) United States Patent
Kumar et al.

(10) Patent No.: US 8,527,826 B2
(45) Date of Patent: Sep. 3, 2013

(54) LOGIC CORRUPTION VERIFICATION

(75) Inventors: Nutan J. P. Kumar, Bangalore (IN); Srinivas V. N. Polisetty, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/290,511

(22) Filed: Nov. 7, 2011

(65) Prior Publication Data

US 2013/0117619 A1 May 9, 2013

(51) Int. Cl.
*G01R 31/28* (2006.01)

(52) U.S. Cl.
USPC .......................................................... 714/741

(58) Field of Classification Search
None
See application file for complete search history.

(56) References Cited

U.S. PATENT DOCUMENTS

| | | | |
|---|---|---|---|
| 5,821,761 A * | 10/1998 | Shida et al. | 324/754.22 |
| 6,941,499 B1 * | 9/2005 | Sung et al. | 714/741 |
| 7,007,214 B2 | 2/2006 | Eustis et al. | |
| 7,010,735 B2 | 3/2006 | Motika et al. | |
| 7,225,374 B2 | 5/2007 | Burdine et al. | |
| 7,392,449 B2 | 6/2008 | Burdine et al. | |
| 7,496,816 B2 | 2/2009 | Bartenstein et al. | |
| 7,509,552 B2 * | 3/2009 | Xiao et al. | 714/741 |
| 7,797,600 B2 | 9/2010 | Bushard et al. | |
| 8,086,924 B2 * | 12/2011 | Forlenza et al. | 714/731 |
| 2006/0090149 A1 * | 4/2006 | Blanco et al. | 716/6 |
| 2007/0061644 A1 * | 3/2007 | Birmiwal et al. | 714/726 |
| 2007/0260950 A1 * | 11/2007 | Morrison et al. | 714/726 |
| 2009/0282307 A1 * | 11/2009 | Chaturvedula et al. | 714/738 |
| 2011/0239070 A1 * | 9/2011 | Morrison | 714/731 |

OTHER PUBLICATIONS

Chun et al., "A Novel Symbolic Simulation for Scan Chain Diagnosis", Department of Electrical and Electronic Engineering, Yonsei University, pp. 333-336.
Makar et al., Iddq Test Pattern Generation for Scan Chain Latches and Flip-Flops, Center for Reliable Computing, Stanford University, Stanford, CA.

* cited by examiner

*Primary Examiner* — Ajay Bhatia
*Assistant Examiner* — Thien D Nguyen
(74) *Attorney, Agent, or Firm* — Michael J. LeStrange; Hoffman Warnick LLC

(57) ABSTRACT

A computer-implemented method of verifying logic in a simulation-based behavioral latch model by performing actions including: inserting a value checking module in the behavioral latch model, the value checking module connected to one of a set of latches outside of a scan chain within the behavioral latch model; comparing a value of the one of the set of latches outside of the scan chain with a delta value for the one of the set of latches outside of the scan chain; and providing an error message in response to determining the value and the delta value are distinct.

12 Claims, 3 Drawing Sheets

LOGIC CORRUPTION VERIFICATION

FIELD OF THE INVENTION

The subject matter disclosed herein relates to solutions for checking for corruption in integrated circuit logic prior to manufacturing of the integrated circuit. More specifically, the subject matter disclosed herein relates to solutions for effectively identifying defects in functions within the hardware description language (HDL) of an integrated circuit during a logic scanning process.

BACKGROUND

In multi-core processors, scanning of circuit logic (e.g., integrated circuit logic) is an important structural design process, supporting a number of functions such as power-on-reset sequencing, data bring-up, error debugging, and recovery. One characteristic of existing scan verification techniques is that they fail to detect corruption in a non-scanned portion of logic, where that corruption is due to a corrupt fence or an architectural bug.

Logic scanning is traditionally used by verification engineers as a last resort (in the design phase) for debugging failures. One of the expectations placed on the scanning process is to identify debugging failures by scanning out a minimum amount of logic without corrupting non-scanned logic. However, it is difficult to design control logic capable of partitioning the circuit into manageable (minimal) pieces using fences/partitions, where the amount of logic in these chip designs continues to increase. In turn, verification engineers face a difficult task of ensuring that each non-scanned piece of logic retains its data after scanning.

BRIEF SUMMARY

A computer-implemented method of verifying logic in a simulation-based behavioral latch model is disclosed. In one embodiment, the method includes: inserting a value checking module in the behavioral latch model, the value checking module connected to one of a set of latches outside of a scan chain within the behavioral latch model; comparing a value of the one of the set of latches outside of the scan chain with a delta value for the one of the set of latches outside of the scan chain; and providing an error message in response to determining the value and the delta value are distinct.

A first aspect of the invention includes a computer-implemented method of verifying logic in a simulation-based behavioral latch model, the method including: inserting a value checking module in the behavioral latch model, the value checking module connected to one of a set of latches outside of a scan chain within the behavioral latch model; comparing a value of the one of the set of latches outside of the scan chain with a delta value for the one of the set of latches outside of the scan chain; and providing an error message in response to determining the value and the delta value are distinct.

A second aspect of the invention includes a system having: at least one computing device configured to verify logic in a simulation-based behavioral latch model by performing actions including: inserting a value checking module in the behavioral latch model, the value checking module connected to one of a set of latches outside of a scan chain within the behavioral latch model; comparing a value of the one of the set of latches outside of the scan chain with a delta value for the one of the set of latches outside of the scan chain; and providing an error message in response to determining the value and the delta value are distinct.

A third aspect of the invention includes a computer program having program code embodied in at least one computer-readable storage medium, which when executed, enables a computer system to determine threshold voltage levels within a macro of integrated circuit cells by performing actions including: inserting a value checking module in the behavioral latch model, the value checking module connected to one of a set of latches outside of a scan chain within the behavioral latch model; comparing a value of the one of the set of latches outside of the scan chain with a delta value for the one of the set of latches outside of the scan chain; and providing an error message in response to determining the value and the delta value are distinct.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

The subject matter disclosed herein relates to solutions for checking for corruption in integrated circuit logic prior to manufacturing of the integrated circuit. More specifically, the subject matter disclosed herein relates to solutions for effectively identifying defects in functions within the hardware description language (HDL) of an integrated circuit during a logic scanning process.

As noted herein, in multi-core processors, scanning of circuit logic (e.g., integrated circuit logic) is an important structural design process, supporting a number of functions such as power-on-reset sequencing, data bring-up, error debugging, and recovery. One downside to existing scan verification techniques is that these techniques fail to detect corruption in a non-scanned portion of logic, where that corruption is due to a corrupt fence or an architectural defect.

Logic scanning is traditionally used by verification engineers as a last resort (in the design phase) for debugging failures. One of the expectations placed on the scanning process is to identify debugging failures by scanning out a minimum amount of logic without corrupting non-scanned logic. However, it is difficult to design control logic capable of partitioning the circuit into manageable (minimal) pieces using fences/partitions, where the amount of logic in these chip designs continues to increase. In turn, verification engineers face a difficult task of ensuring that each non-scanned piece of logic (e.g., one or more latches) retains its data after scanning. Traditionally, monitoring of a large number of latches (e.g., millions of latches) involves a long scanning run time and high memory usage. Prior attempts have used a divide-and-run approach to tackle the large amount of data in smaller chunks, however, this approach is prone to the above-noted problems associated with non-scanned latches.

In contrast to conventional approaches, aspects of the invention allow for monitoring non-scanned latches during scanning, to ensure those latches retain their data both during the scan and after the scanning concludes. The approach includes utilizing a simulation-only behavioral latch model, which asserts an error or warning message to the simulator when it detects a change in the latch value. The assertion logic can be controlled by a dial. Use of one or more dials allows for minimal impact on simulation run time, as the dial(s) will not interact with the simulator at every simulation cycle. Additionally, one or more dial(s) can reduce the memory requirement, as the user code can be trimmed to remove code for monitoring the latches within the purview of the dial(s).

Figure 1:
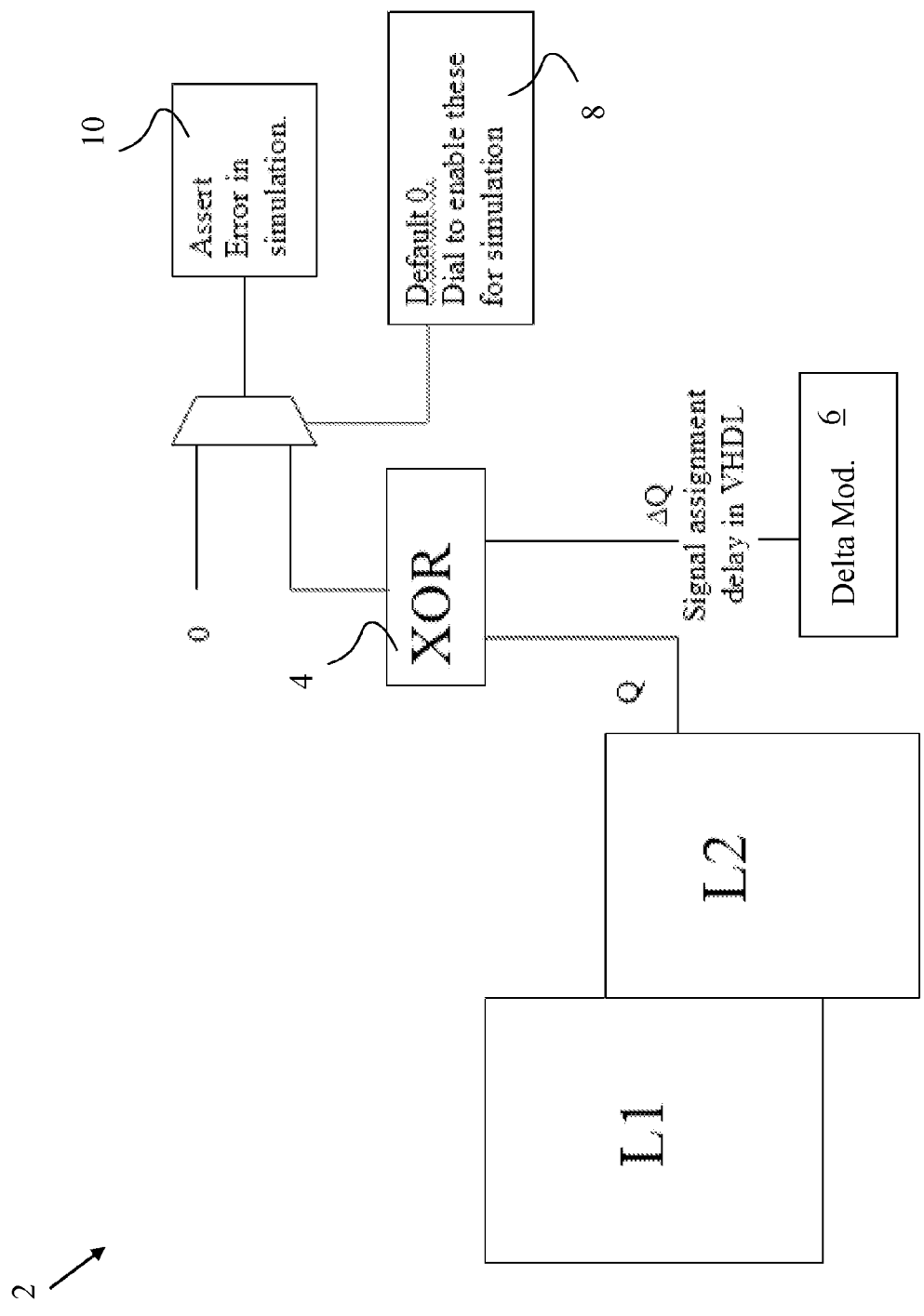
FIG. 1 shows a schematic depiction of a logic diagram according to embodiments of the invention.

More particularly, aspects of the invention include adding logic to the traditional simulation model for circuit latches, where the additional logic allows for monitoring of all latches in the circuit logic. Turning to FIG. 1, a schematic depiction of a logic diagram 2 is shown according to embodiments.

In this embodiment, one or more of the latches in the chip can include logic configured to check for an instantaneous change in value of the latch output. As shown in FIG. 1, the logic diagram 2 depicts a logic circuit (e.g., in a hardware design language), where the circuit includes a set of latches L1, L2, etc., a value checking module (XOR) 4 for checking a value of one or more of the set of latches L1, L2, a delta module 6 connected to the value checking module (XOR) 4, where the delta module 6 provides a delta value of one of the set of latches L1, L2, etc., and a dial switch 8 for initiating the value checking module 4 to compare the value of the one of the set of latches (L1, L2, etc.) with the delta value (from delta module 6) of the one of the set of latches (L1, L2, etc.).

As shown, the value checking module (XOR) 4 gate determines whether there is a change between the present value (Q) of a latch signal and a delayed value (ΔQ) of the signal (from delta module 6). The ability to check for these changes in value is controlled by the dial switch 8. The dial switch 8 can be turned from its default "off" setting (zero), to its "on" setting (one), and when on, can check for differences in the Q values from latches (L1, L2, etc.) and the ΔQ values for those respective latches (L1, L2, etc.). In the case that the Q value and the ΔQ do not match, an error module 10 can generate an error message indicating the error. In some embodiments, the error module 10 can log the error messages in a log, e.g., in a hardware design language such as VHDL. It is understood that the latches (L1, L2, etc.) shown and described herein are latches in a circuit design which are not undergoing a scan process. That is, these latches (L1, L2, etc.) are non-scanned latches, which can be monitored according to embodiments, in order to ensure these non-scanned latches retain their data during the scan, and after the scanning concludes. The checking can be initiated by switching the dial switch 8 from its "off" position (zero) to its "on" position (1). This can be initiated via any conventional means, including programming language, pre-programmed instructions, user initiation, etc.

Figure 2:
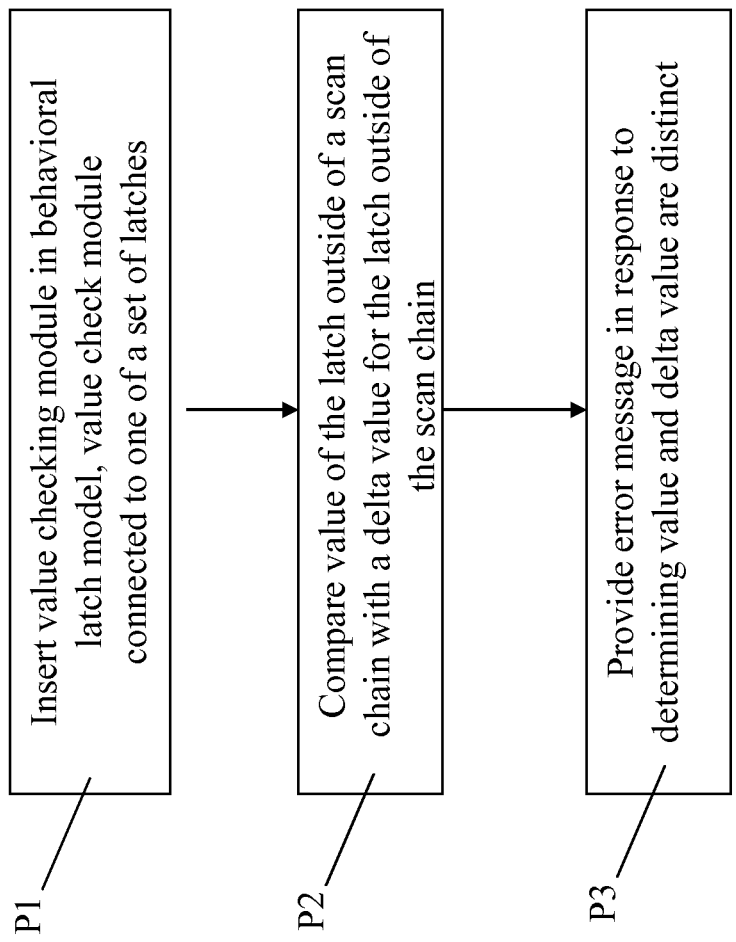
FIG. 2 shows an illustrative process flow according to embodiments of the invention.

FIG. 2 shows an illustrative process flow diagram, depicting processes in a computer-implemented method according to embodiments of the invention. It is understood that the methodology described herein can refer to performing processes on a single latch, a set of latches, or all latches in a circuit design that fall outside of the scan chain. As shown the process can include verifying logic in a simulation-based (or, simulation-only) behavioral latch model, where the method includes:

Process P1 can include inserting a value checking module in the behavioral latch model, the value checking module connected to one (or more) of a set of latches in the behavioral latch model. This can include inserting a module such as value checking module (XOR) 4 in FIG. 1, into the hardware description language, and connecting that value checking module (XOR) 4 to one or more latches (L1, L2, etc.) outside of the scan chain.

After process P1, process P2 can include comparing a value of the one (or more) of the set of latches (L1, L2, etc.) outside of a scan chain with a delta value (from delta module 6) for the one (or more) of the set of latches (L1, L2, etc.). It is understood, that as noted herein, in some embodiments the set of latches can include all of the latches in the circuit design which are outside of the scan chain. In other cases, the set of latches can include a subset of the entire group outside of the scan chain.

After process P2, process P3 can include providing an error message (error module 10) in response to determining the value and the delta value are distinct for the latch (or multiple latches) in the set of latches (L1, L2, etc.).

It is understood that processes P1-P3 can be repeated for any number of latches outside of the scanned latch chain, and that these processes can be repeated on a predetermined schedule.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

Figure 3:
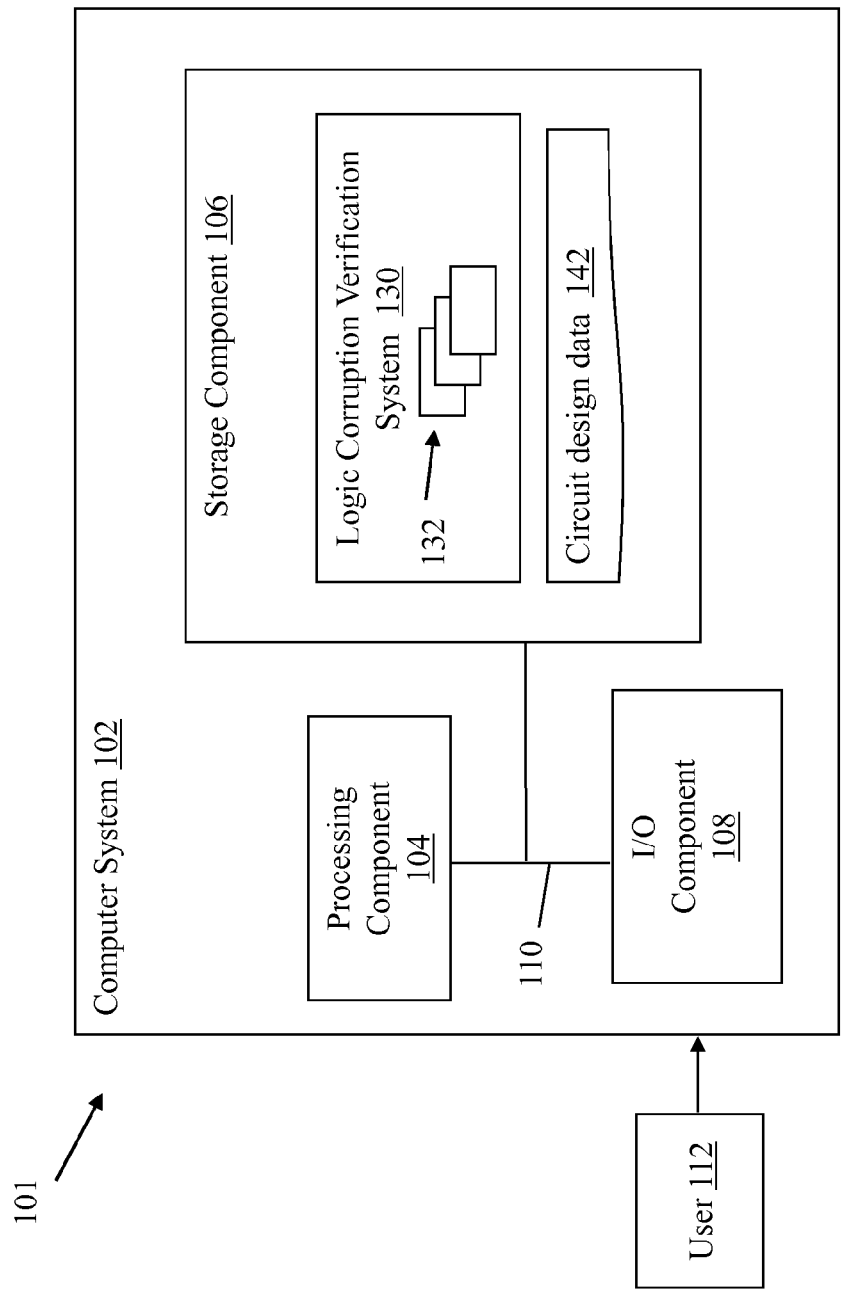
FIG. 3 shows a schematic depiction of an environment for logic corruption verification according to embodiments of the invention.

FIG. 3 depicts an illustrative environment 101 for verifying logic corruption in an integrated circuit design (e.g., in a hardware language) according to embodiments. To this extent, the environment 101 includes a computer system 102 that can perform a process described herein in order to integrate manufacturing feedback into an integrated circuit structure design. In particular, the computer system 102 is shown as including a logic corruption verification system 130, which makes computer system 102 operable to check for logic corruption in a circuit design (prior to manufacture) by performing any/all of the processes described herein and implementing any/all of the embodiments described herein.

The computer system 102 is shown including a processing component 104 (e.g., one or more processors), a storage component 106 (e.g., a storage hierarchy), an input/output (I/O) component 108 (e.g., one or more I/O interfaces and/or devices), and a communications pathway 110. In general, the processing component 104 executes program code, such as the logic corruption verification system 130, which is at least partially fixed in the storage component 106. While executing program code, the processing component 104 can process data, which can result in reading and/or writing transformed data from/to the storage component 106 and/or the I/O component 108 for further processing. The pathway 110 provides a communications link between each of the components in the computer system 102. The I/O component 108 can comprise one or more human I/O devices, which enable a human user 112 to interact with the computer system 102 and/or one or more communications devices to enable a system user 112 to communicate with the computer system 102 using any type of communications link. To this extent, the Logic corruption verification system 130 can manage a set of interfaces (e.g., graphical user interface(s), application program interface, etc.) that enable human and/or system users 112 to interact with the logic corruption verification system 130. Further, the logic corruption verification system 130 can manage (e.g., store, retrieve, create, manipulate, organize, present, etc.) data, such as circuit design data 142 using any solution.

In any event, the computer system 102 can comprise one or more general purpose computing articles of manufacture (e.g., computing devices) capable of executing program code, such as the logic corruption verification system 130, installed thereon. As used herein, it is understood that "program code" means any collection of instructions, in any language, code or notation, that cause a computing device having an information processing capability to perform a particular function either directly or after any combination of the following: (a) conversion to another language, code or notation; (b) reproduction in a different material form; and/or (c) decompression. To this extent, the logic corruption verification system 130 can be embodied as any combination of system software and/or application software.

Further, the logic corruption verification system 130 can be implemented using a set of modules 132. In this case, a module 132 can enable the computer system 102 to perform a set of tasks used by the logic corruption verification system 130, and can be separately developed and/or implemented apart from other portions of the Logic corruption verification system 130. As used herein, the term "component" means any configuration of hardware, with or without software, which implements the functionality described in conjunction therewith using any solution, while the term "module" means program code that enables the computer system 102 to implement the functionality described in conjunction therewith using any solution. When fixed in a storage component 106 of a computer system 102 that includes a processing component 104, a module is a substantial portion of a component that implements the functionality. Regardless, it is understood that two or more components, modules, and/or systems may share some/all of their respective hardware and/or software. Further, it is understood that some of the functionality discussed herein may not be implemented or additional functionality may be included as part of the computer system 102.

When the computer system 102 comprises multiple computing devices, each computing device may have only a portion of logic corruption verification system 130 fixed thereon (e.g., one or more modules 132). However, it is understood that the computer system 102 and logic corruption verification system 130 are only representative of various possible equivalent computer systems that may perform a process described herein. To this extent, in other embodiments, the functionality provided by the computer system 102 and logic corruption verification system 130 can be at least partially implemented by one or more computing devices that include any combination of general and/or specific purpose hardware with or without program code. In each embodiment, the hardware and program code, if included, can be created using standard engineering and programming techniques, respectively.

Regardless, when the computer system 102 includes multiple computing devices, the computing devices can communicate over any type of communications link. Further, while performing a process described herein, the computer system 102 can communicate with one or more other computer systems using any type of communications link. In either case, the communications link can comprise any combination of various types of wired and/or wireless links; comprise any combination of one or more types of networks; and/or utilize any combination of various types of transmission techniques and protocols.

The computer system 102 can obtain or provide data, such as circuit design data 142 using any solution. For example, the computer system 102 can generate and/or be used to circuit design data 142, retrieve circuit design data 142, from one or more data stores, receive circuit design data 142, from another system, send circuit design data 142 to another system, etc.

While shown and described herein as a method, system and computer program product for checking for logic corruption in a circuit design (prior to manufacture), it is understood that aspects of the invention further provide various alternative embodiments. For example, in one embodiment, the invention provides a computer program fixed in at least one computer-readable medium, which when executed, enables a computer system to check for logic corruption in a circuit design (prior to manufacture). To this extent, the computer-readable medium includes program code, such as the logic corruption verification system 130 (FIG. 3), which implements some or all of the processes and/or embodiments described herein. It is understood that the term "computer-readable medium" comprises one or more of any type of tangible medium of expression, now known or later developed, from which a copy of the program code can be perceived, reproduced, or otherwise communicated by a computing device. For example, the computer-readable medium can comprise: one or more portable storage articles of manufacture; one or more memory/storage components of a computing device; paper; etc.

In another embodiment, the invention provides a method of providing a copy of program code, such as the logic corruption verification system 130 (FIG. 3), which implements some or all of a process described herein. In this case, a computer system can process a copy of program code that implements some or all of a process described herein to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of checking for logic corruption in a circuit design (prior to manufacture). In this case, a computer system, such as the computer system 102 (FIG. 3), can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; etc.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A computer-implemented method of verifying logic in a simulation-based behavioral latch model by performing actions comprising:
   inserting a value checking module in the behavioral latch model, the value checking module connected to one of a set of latches outside of a scan chain within the behavioral latch model,
   wherein the set of latches outside of the scan chain includes all latches in the behavior latch model that are outside of the scan chain,
   wherein the inserting of the value checking module in the behavioral latch model includes connecting the value checking module to only latches outside of the scan chain;
   comparing a value of a latch signal for the one of the set of latches outside of the scan chain with a delta value of the latch signal for the one of the set of latches outside of the scan chain, the delta value representing a time delayed value of the latch signal,
   wherein the comparing is initiated using a dial switch,
   wherein the dial switch is initially set to an off value, and
   wherein the comparing includes switching the dial switch from the off value to an on value; and
   providing an error message in response to determining the value and the delta value are distinct.

2. The computer-implemented method of claim 1, wherein the error message is provided to a user interface.

3. The computer-implemented method of claim 1, further comprising calling for the delta value prior to the comparing.

4. The computer-implemented method of claim 3, wherein the delta value is provided in a hardware design language.

5. A system comprising:
   at least one computing device configured to verify logic in a simulation-based behavioral latch model by performing actions including:
      inserting a value checking module in the behavioral latch model, the value checking module connected to one of a set of latches outside of a scan chain within the behavioral latch model,
      wherein the set of latches outside of the scan chain includes all latches in the behavior latch model that are outside of the scan chain,
      wherein the inserting of the value checking module in the behavioral latch model includes connecting the value checking module to only latches outside of the scan chain;
      comparing a value of a latch signal for the one of the set of latches outside of the scan chain with a delta value of the latch signal for the one of the set of latches outside of the scan chain, the delta value representing a time delayed value of the latch signal,
      wherein the comparing is initiated using a dial switch,
      wherein the dial switch is initially set to an off value, and
      wherein the comparing includes switching the dial switch from the off value to an on value; and
      providing an error message in response to determining the value and the delta value are distinct.

6. The system of claim 5, wherein the error message is provided to a user interface.

7. The system of claim 5, wherein the at least one computing device is further configured to call for the delta value prior to the comparing.

8. The system of claim 7, wherein the delta value is provided in a hardware design language.

9. A computer program comprising program code embodied in at least one computer-readable storage medium, which when executed, enables a computer system to determine threshold voltage levels within a macro of integrated circuit cells by performing actions comprising:
   inserting a value checking module in the behavioral latch model, the value checking module connected to one of a set of latches outside of a scan chain within the behavioral latch model,
   wherein the set of latches outside of the scan chain includes all latches in the behavior latch model that are outside of the scan chain,
   wherein the inserting of the value checking module in the behavioral latch model includes connecting the value checking module to only latches outside of the scan chain;
   comparing a value of a latch signal for the one of the set of latches outside of the scan chain with a delta value of the latch signal for the one of the set of latches outside of the scan chain, the delta value representing a time delayed value of the latch signal,
   wherein the comparing is initiated using a dial switch,
   wherein the dial switch is initially set to an off value, and
   wherein the comparing includes switching the dial switch from the off value to an on value; and
   providing an error message in response to determining the value and the delta value are distinct.

10. The computer program of claim 9, wherein the error message is provided to a user interface.

11. The computer program of claim 9, further comprising calling for the delta value prior to the comparing.

12. The computer program of claim 11, wherein the delta value is provided in a hardware design language.

* * * * *